US009857687B2

(12) United States Patent
Tsuge et al.

(10) Patent No.: US 9,857,687 B2
(45) Date of Patent: Jan. 2, 2018

(54) METHOD OF MANUFACTURING SUBSTRATE AND SUBSTRATE AND MASK FILM

(71) Applicants: TOKAI SHINEI ELECTRONICS INDUSTRY CO., LTD, Gifu (JP); Tadayoshi Saito, Kanagawa (JP); YAMATOYA & CO., LTD, Tokyo (JP)

(72) Inventors: Kazunori Tsuge, Ena (JP); Yoshihito Tanaka, Ena (JP); Koji Akiyama, Ena (JP); Kiyoshi Tanaka, Ena (JP); Kazuyoshi Nishio, Ena (JP); Takehiro Kato, Ena (JP); Masaru Murakami, Ena (JP); Tadayoshi Saito, Yokohama (JP); Hirotoshi Yoshimura, Tokyo (JP); Akira Inoue, Tokyo (JP); Iwao Numakura, Tokyo (JP); Noriaki Tsukada, Tokyo (JP)

(73) Assignees: TOKAI SHINEI ELECTRONICS INIDUSTRY CO., LTD, Gifu (JP); Tadayoshi Saito, Kanagawa (JP); YAMATOYA & CO., LTD, Tokyo (JP)

( * ) Notice: Subject to any disclaimer, the term of this patent is extended or adjusted under 35 U.S.C. 154(b) by 0 days.

(21) Appl. No.: 14/770,979

(22) PCT Filed: Feb. 26, 2014

(86) PCT No.: PCT/JP2014/054601
§ 371 (c)(1),
(2) Date: Aug. 27, 2015

(87) PCT Pub. No.: WO2014/132974
PCT Pub. Date: Sep. 4, 2014

(65) Prior Publication Data
US 2016/0011514 A1 Jan. 14, 2016

(30) Foreign Application Priority Data

Feb. 28, 2013 (JP) .................................. 2013-054068
Dec. 18, 2013 (JP) .................................. 2013-261532
Dec. 24, 2013 (JP) .................................. 2013-266146

(51) Int. Cl.
| G03F 7/004 | (2006.01) |
| G03F 7/09 | (2006.01) |
| G03C 1/76 | (2006.01) |
| G03C 1/95 | (2006.01) |
| G03F 7/20 | (2006.01) |
| G03F 7/11 | (2006.01) |
| H01L 23/498 | (2006.01) |
| H05K 1/02 | (2006.01) |
| H05K 3/28 | (2006.01) |
| G03F 1/50 | (2012.01) |
| G03F 7/32 | (2006.01) |
| G03F 7/40 | (2006.01) |
| H05K 3/34 | (2006.01) |

(52) U.S. Cl.
CPC ............ *G03F 7/2002* (2013.01); *G03C 1/76* (2013.01); *G03C 1/95* (2013.01); *G03F 1/50* (2013.01); *G03F 7/11* (2013.01); *G03F 7/2022* (2013.01); *G03F 7/32* (2013.01); *G03F 7/40* (2013.01); *H01L 23/49894* (2013.01); *H05K 1/0269* (2013.01); *H05K 3/287* (2013.01); *H01L 2924/0002* (2013.01); *H05K 3/341* (2013.01); *H05K 2201/099* (2013.01); *H05K 2201/09936* (2013.01); *H05K 2203/056* (2013.01); *H05K 2203/0571* (2013.01)

(58) Field of Classification Search
CPC .......... G03F 7/0382; G03F 7/40; G03F 7/038; G03F 7/09
USPC ........ 430/270.1, 280.1, 312, 325, 14, 17, 18
See application file for complete search history.

(56) References Cited

U.S. PATENT DOCUMENTS

| 5,009,982 A | 4/1991 | Kamayachi et al. |
| 5,512,712 A | 4/1996 | Iwata et al. |
| 6,602,651 B1 * | 8/2003 | Yoshitake ............... C08G 65/34 430/280.1 |
| 9,265,161 B2 | 2/2016 | Ahn et al. |
| 2010/0224872 A1 * | 9/2010 | Kimura ............... H01L 27/1214 257/43 |

(Continued)

FOREIGN PATENT DOCUMENTS

| CN | 1647596 | 7/2005 |
| CN | 101324750 | 12/2008 |

(Continued)

OTHER PUBLICATIONS

International Search Report dated May 13, 2014 in International Application No. PCT/JP2014/054601.

(Continued)

*Primary Examiner* — John S Chu
(74) *Attorney, Agent, or Firm* — Wenderoth, Lind & Ponack, L.L.P.

(57) ABSTRACT

A method of manufacturing a substrate includes applying solder resist ink containing a mixing resin of epoxy-based resin and acrylic-based resin on at least one surface of a substrate body to form a solder resist layer, and irradiating a predetermined portion of the solder resist layer with ultraviolet rays and controlling an amount of irradiation of the ultraviolet rays irradiated to the predetermined of the solder resist layer to form the predetermined portion in transmissivity that transmits light.

12 Claims, 8 Drawing Sheets

(56) References Cited

U.S. PATENT DOCUMENTS

| | | |
|---|---|---|
| 2011/0026208 A1 | 2/2011 | Utsuro et al. |
| 2011/0132639 A1 | 6/2011 | Saito et al. |

FOREIGN PATENT DOCUMENTS

| | | |
|---|---|---|
| CN | 101925474 | 12/2010 |
| CN | 102083280 | 6/2011 |
| CN | 102088823 | 6/2011 |
| CN | 102673036 | 9/2012 |
| EP | 2 360 026 | 8/2011 |
| JP | 54-113048 | 8/1979 |
| JP | 61-243869 | 10/1986 |
| JP | 7-15118 | 1/1995 |
| JP | 7-62067 | 3/1995 |
| JP | 7-231149 | 8/1995 |
| JP | 2743100 | 4/1998 |
| JP | 3019503 | 3/2000 |
| JP | 2000-306453 | 11/2000 |
| JP | 2002-214778 | 7/2002 |
| JP | 2003-242853 | 8/2003 |
| JP | 5100850 | 12/2012 |
| JP | 2013-125920 | 6/2013 |
| WO | 03/088724 | 10/2003 |
| WO | 2010/070788 | 6/2010 |

OTHER PUBLICATIONS

Korean Office Action dated Oct. 26, 2016 in corresponding KR Application No. 10-2015-7025148.

* cited by examiner

CASE WHERE COLORED INK IS USED AS PRIMARY LAYER

FIG.5 MASK FILM PROVIDED WITH LIGHT AND SHADE

FIG.6 AFTER DEVELOPMENT

FIG.7 PRIMARY EXPOSURE

FIG.8  SECONDARY EXPOSURE

FIG.9  SCHEMATIC VIEW SHOWING DIFFERENCE IN CROSSLINK DENSITY AND AMOUNT OF POLYMERIZATION DEGREE OF FILM BY EXPOSURE AMOUNT

FIG.10

CASE WHERE COLORED INK IS USED BETWEEN MSR LAYERS

METHOD OF MANUFACTURING SUBSTRATE AND SUBSTRATE AND MASK FILM

TECHNICAL FIELD

The present invention relates to a method of manufacturing a substrate in which a solder resist layer is provided on at least one surface of a substrate body, a substrate and a mask film.

BACKGROUND ART

A circuit substrate in which a circuit pattern is formed on one surface or both surfaces of the circuit substrate is conventionally known (see Patent Literature 1).

The circuit substrate is provided with a solder resist layer to protect the circuit pattern. A letter, a mark or the like to mount electronic parts is displayed on an upper surface of the solder resist layer.

The letter, the mark or the like is formed by forming an ink layer on the solder resist layer, exposing the ink layer by irradiating the ink layer with ultraviolet rays through a film, and heating and hardening ink remaining as a shape portion representing the letter or the like after developing the ink layer.

CITATION LIST

Patent Literature

Patent Literature 1: JP 2002-214778

SUMMARY

Technical Problem

In this way, because the ink layer is formed on the solder resist layer, the ink layer is exposed and developed, and thereafter the heating process and so on are executed, there is a problem in that the ink is required to form the letter or the like, a great amount of ink is discharged in a developing process, many manufacturing processes are required and the manufacturing is very troublesome.

An object of the present invention is to provide a method of manufacturing a substrate capable of displaying a letter or the like with a small number of processes by use of a solder resist layer, a substrate manufactured by the method of manufacturing and a mask film used in the method of manufacturing a substrate.

Solution to Problem

A method of manufacturing a substrate according to the present invention includes applying solder resist ink containing a mixing resin of epoxy-based resin and acrylic-based resin on at least a surface of a substrate body to form a solder resist layer, and irradiating a predetermined portion of the solder resist layer with ultraviolet rays and controlling an amount of irradiation of the ultraviolet rays irradiated to the predetermined portion of the solder resist layer to form the predetermined portion in transmissivity that transmits light.

Advantageous Effects

According to the method, it is possible to provide a substrate capable of displaying a letter or the like with a less number of processes.

BRIEF DESCRIPTION OF DRAWINGS

FIG. 4 is a schematic view showing the circuit substrate in the second embodiment in section, before forming a letter or the like.

DESCRIPTION OF EMBODIMENTS

Embodiments of a method of manufacturing a substrate, a substrate and a mask film according to the present invention will be described hereinafter with reference to the accompanying drawings.

[First Embodiment]

Figure 1:
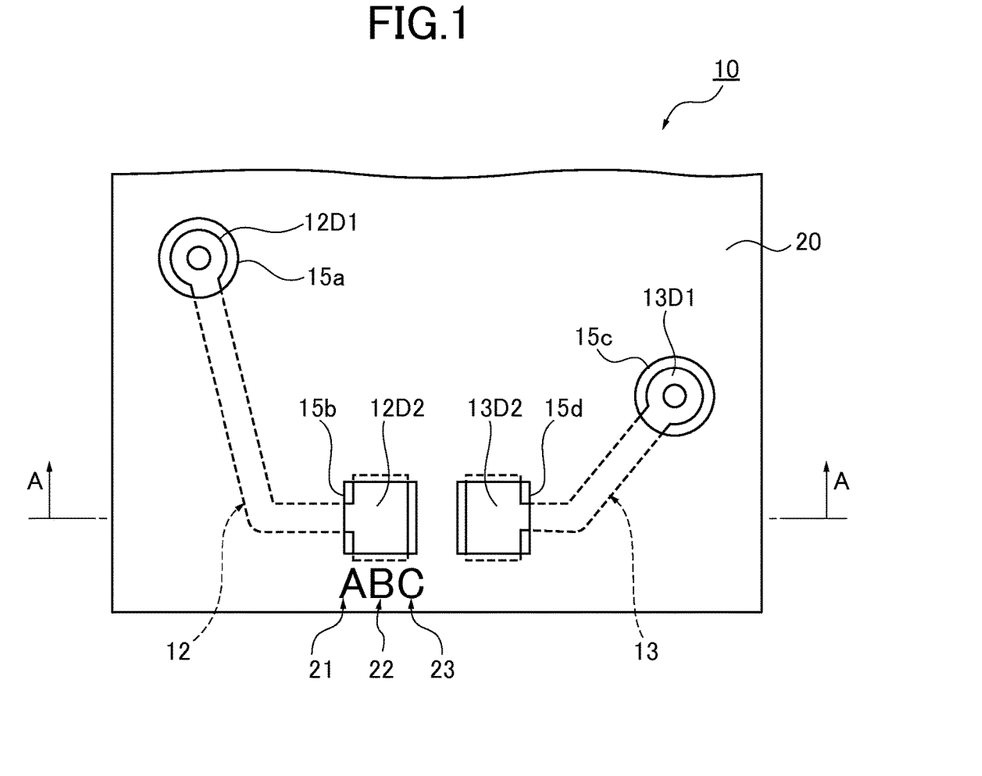
FIG. 1 is a plan view showing a circuit substrate according to the present invention.
Figure 2:
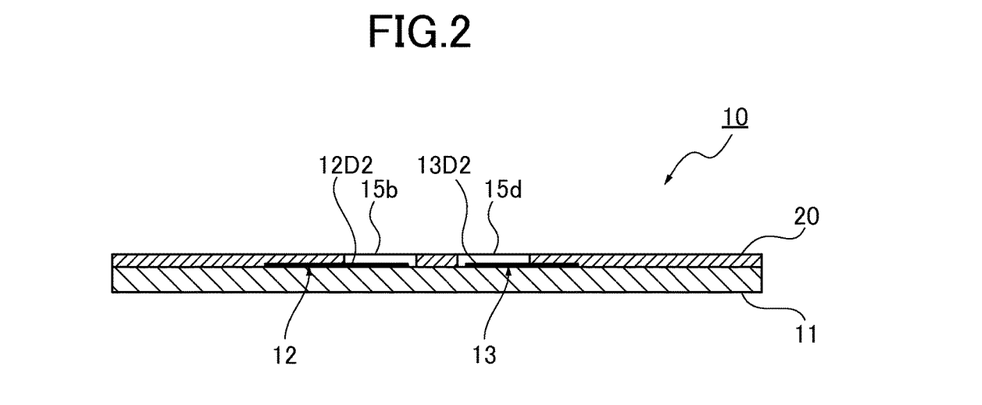
FIG. 2 is a sectional view taken along line A-A of the circuit substrate shown in FIG. 1.
Figure 3:
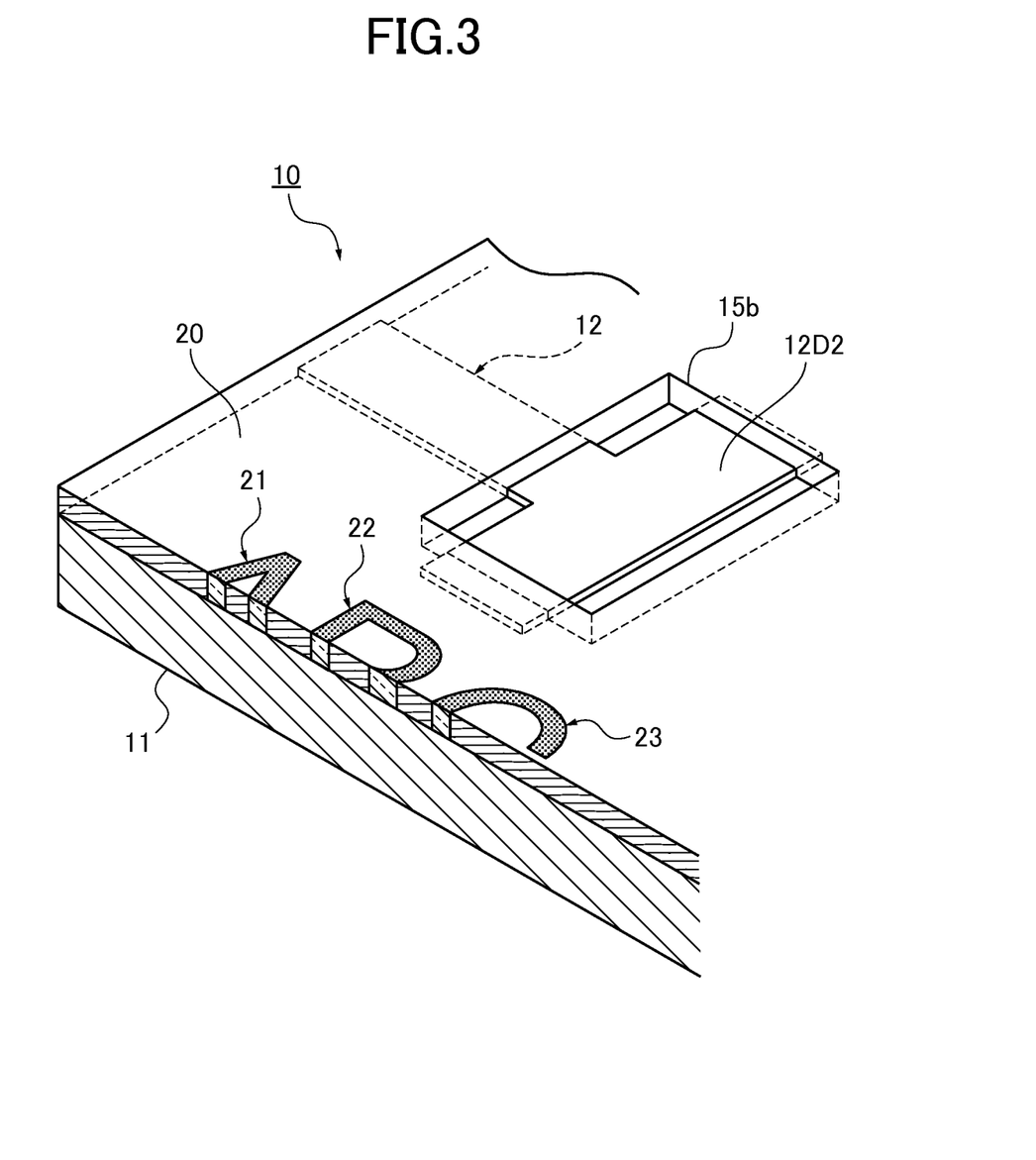
FIG. 3 is a partially sectional perspective view of a part of the circuit substrate shown in FIG. 1.

A circuit substrate (substrate) 10 shown in FIGS. 1 to 3 is composed of a circuit substrate body 11, circuit patterns 12 and 13 provided on at least one surface (upper surface) on of the circuit substrate body 11 and formed by, for example, a copper foil, and a solder resist layer 20 formed on the circuit patterns 12 and 13 and the circuit substrate body 11.

Parts of the solder resist layer 20 above lands 12D1, 12D2, 13D1 and 13D2 of the circuit patterns 12 and 13 are removed to form holes 15a to 15d. The lands 12D1, 12D2, 13D1 and 13D2 of the circuit patterns 12 and 13 are exposed by the holes 15a to 15d. An electronic part and so on are soldered to the lands 12D1, 12D2, 13D1 and 13D2.

Display parts 21, 22 and 23 such as letters of A, B and C and so on as viewed from a plane are transparent, in other words, light transmissive, and the letters of A, B and C are displayed on the solder resist layer 20 with a foundation color of the circuit substrate body 11. Note that the solder resist layer 20 has a color different from a color of the circuit substrate body 11.

In this way, the formation of a part of the solder resist layer 20 in a transparent part of a predetermined shape makes it possible to display information (for example, letters or marks (including figures or marks) and so on of the electronic parts mounted on the circuit substrate 10. In other words, letters or marks can be displayed with the shape of the display parts 21 to 23.

The solder resist layer 20 is formed by a mixing resin of epoxy-based resin and acrylic-based resin. The display parts 21 to 23 (information display parts) which are the predetermined parts are transparent and the other part is opaque.

The Inventors found out that, if a small amount of ultraviolet rays were irradiated to a mixing resin of the epoxy-based resin and acrylic-based resin, a surface only of the irradiated part was hardened, a layer of the irradiated part remained without being removed while maintaining transmissivity by a developing processing, and the irradiated part had a high transmissivity and was hardened.

By use of the nature, letters and so on are displayed on the circuit substrate 10. It is possible to manufacture the circuit substrate that displays the letters and so on by only changing strength of irradiation strength in an irradiation process of ultraviolet rays which is a usual process. Further, without mixing the mixing resin of the thermosetting epoxy-based resin and the photosetting acrylic-based resin with another material or adding the another material to the mixing resin, because only the solder resist layer to protect the circuit pattern is employed, it is possible to manufacture the circuit substrate with an existing equipment without introducing a new device.

According to the circuit substrate 10, because the display parts 21 to 23 of the solder resist layer 20 displaying the letters A, B and C are transparently formed and a ground color of the circuit substrate body 11 can be visually recognized through the display parts 21 to 23 to display the letters A, B and C, it is possible to reduce the number of manufacturing steps without executing exposure, development and heat treatment by providing an ink layer on the solder resist layer 20 as prior art. In addition, even if a surface of the display parts 21 to 23 is scratched, display contents do not disappear.

[Second Embodiment]

Figure 3A:
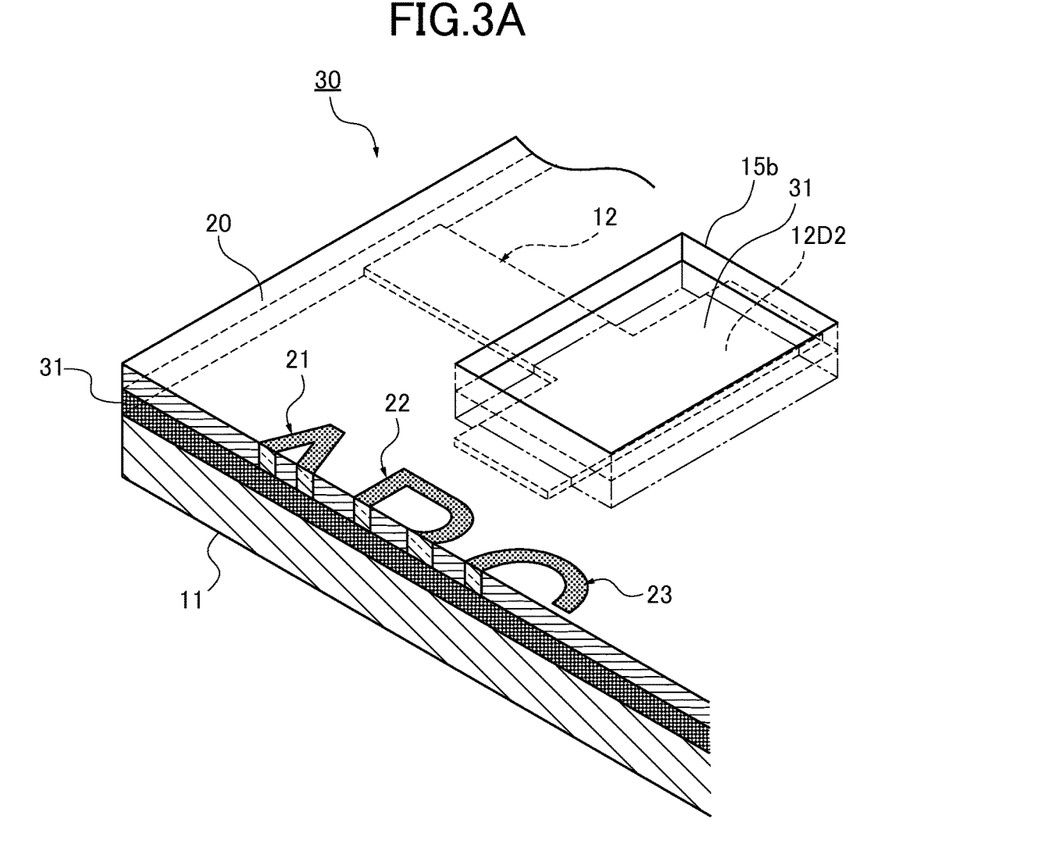
FIG. 3A is a partially sectional perspective view showing a circuit substrate in a second embodiment.

FIG. 3A illustrates a circuit substrate 30 in a second embodiment. The circuit substrate 30 includes an ink layer 31 (colored layer) as a primer layer provided between a circuit substrate body 11 and a solder resist layer 20. Letters A, B and C are displayed by color of the ink layer 31. By selecting the color of the ink layer 31, it is possible to display further clearly letters and so on.

In the second embodiment, the colored layer 31 is formed by ink. However, if the colored layer can be formed, it is not limited to the ink.

[Method of Manufacturing]

Next, a method of manufacturing the circuit substrate 30 which is the substrate is described briefly.

[First Manufacturing Method]

Figure 4:
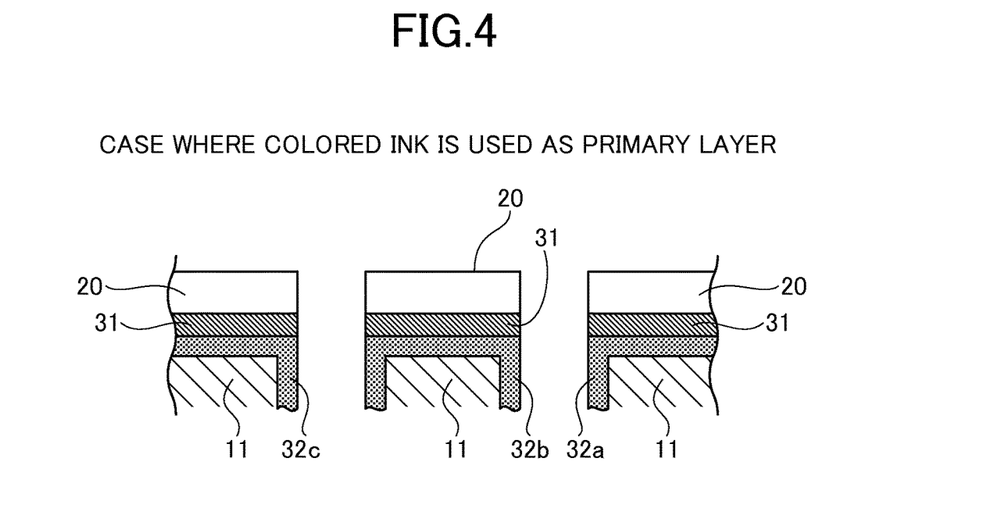

The ink layer 31 as the primer layer is first formed on the circuit substrate body 11 on which circuit patterns 32a to 32c are prepared in a previous process, as shown in FIG. 4 (although the circuit patterns 32a to 32c are not shown in FIG. 3A, in the embodiment, an explanation is made assuming that they are shown for convenience of explanation). The ink layer 31 is directly formed on portions of the circuit substrate body 11 where the circuit patterns 32a to 32c are not provided (not shown).

The ink layer 31 has a thickness within a range of 2 μm to 300 μm, preferably 5 μm to 150 μm. The formation of the ink layer 31 is executed by, for example, a coating or printing such as screen printing, roll coat, curtain coat, spray coat, bar coat, ink jet, electrostatic coating and so on, similar to prior art. The colored ink forming the ink layer 31 has functional group.

Next, after the ink layer 31 is dried, the solder resist layer 20 is formed. The solder resist layer 20 has preferably a thickness of a range of 5 μm to 150 μm. The formation of the solder resist layer 20 is carried out by the same coating or printing as that of the ink layer 31.

Figure 5:
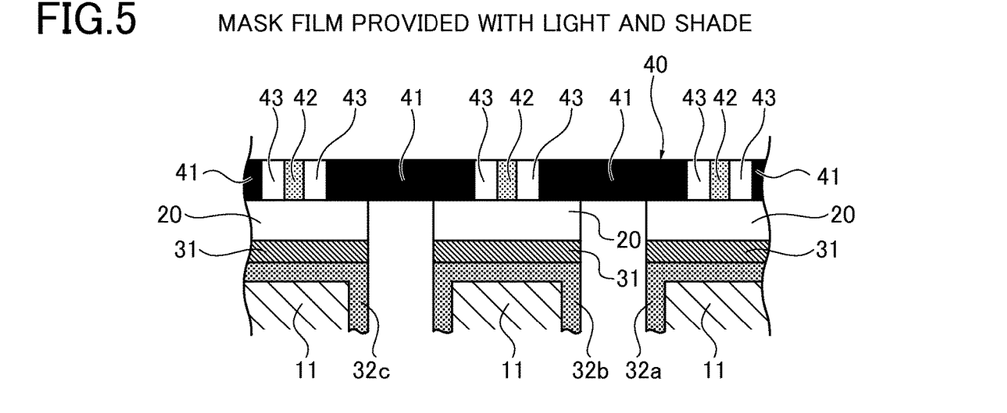
FIG. 5 is an explanatory view showing a state where a mask film is covered on the circuit substrate shown in FIG. 4.

After the solder resist layer 20 is dried, a light and shade mask film (mask film) 40 to form the display parts 21 to 23 is covered on the solder resist layer 20, as shown in FIG. 5. A black portion 41 of the light and shade mask film 40 cuts ultraviolet rays and a dot portion 42 is a portion transmitting a small amount of the ultraviolet rays, that is to say, a portion reducing an irradiation amount of the ultraviolet rays. A white portion 43 is a portion transmitting approximately 100% of ultraviolet rays.

Here, the dot portion 42 is a first portion which has a low transmittance of the ultraviolet rays, the white portion 43 is a second portion which has a high transmittance of the ultraviolet rays and the black portion 41 is a third portion which does not transmit ultraviolet rays. Thus, a predetermined pattern is formed by the dot portion 42, the white portion 43 and the black portion 41.

Ultraviolet rays are irradiated to the light and shade mask film 40 to expose the solder resist layer 20. An irradiation amount of the ultraviolet rays at this time is 10 to 2000 [mJ/cm$^2$], preferably 100 to 1500 [mJ/cm$^2$].

By this exposure, a portion of the solder resist layer 20 where ultraviolet rays are strongly irradiated is hardened and becomes opaque. A portion where weak ultraviolet rays are irradiated has transmissivity that transmits light and is hardened in a transparent state.

In 10 [mJ/cm$^2$] or less of the irradiation amount, the other portion than the display parts 21 to 23 (see FIG. 1) becomes a transparent state, and hence the letters A, B and C are unclear. In 2000 [mJ/cm$^2$] or more of the irradiation amount, a reaction excessively proceeds, the display parts 21 to 23 are opaque and the letters are obscure. In addition, a wasting working time and a fogging phenomenon occur.

Figure 6:
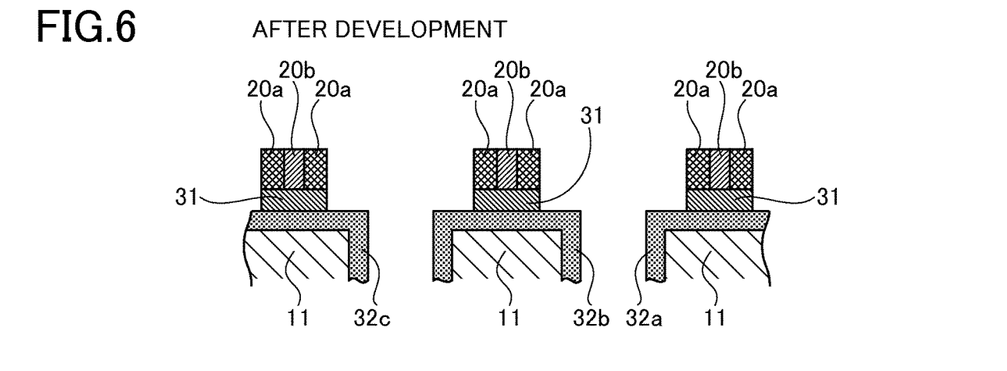
FIG. 6 is a schematic sectional view showing the circuit substrate in the second embodiment in section, in which the letter or the like is formed.

Next, by executing a developing process, the portion of the solder resist layer 20 where ultraviolet rays are not irradiated is removed and the portion remains, as shown in FIG. 6. By this removal, for example, holes 15a to 15d are formed, as shown in FIG. 1.

A residual part 20a is formed by a large amount of ultraviolet rays and a residual part 20b is formed by a small amount of ultraviolet rays. The residual part 20a is transparent and the residual part 20b is opaque. Note that, if the solder resist layer 20 is removed, a portion of the ink layer 31 located at a lower side of the removed portion is also removed, the portion of the ink layer 31 located at the lower side of the residual parts 20a and 20b is not removed by the developing process because the residual parts 20a and 20b exist.

Thereafter and after drying, the residual parts 20a and 20b are fixed to the ink layer 31 by a heating process to complete the circuit substrate 30. The residual part 20b has a high transmissivity by the heating process. That is to say, the heating process makes it possible to change refractive index or transparency of the residual part 20*b* and further clearly visually recognize a shape of the residual part 20*b* which is a predetermined part by a difference in the refractive index or the transparency between the residual part 20*b* and the residual part 20*a* through the foundation color.

By the way, a mixing ratio of the epoxy-based resin and the acrylic-based resin of the solder resist layer 20 is any set. However, a proportion of the epoxy-based resin is preferably about 40% to 80%, if the epoxy-based resin has a large proportion, the letters A, B and C are clear. Therefore, the proportion of the epoxy-based resin to clear the letters is 50.1% to 64%. On the other hand, in the epoxy-based resin of 40% or less, or 80% or more, the contrast of the transparent part and the opaque part is hard to be obtained to an irradiation change in ultraviolet rays, the letters are unclear.

The drying of the solder resist layer 20 may be maintained to such as extent as not to interfere with the next exposure process. In a drying process, the temperature is 40° C., the time is 5 to 10 minutes, preferably 10 to 70 minutes. If the drying state is insufficient, a mixture resin of the solder resist layer 20 is adhered to the light and shade mask film 40, and it takes a time to remove the adhered mixture resin, thereby occurring low work efficiency. In addition, by the mixture resin adhering to the light and shade mask film 40, a thickness of the solder resist layer 20 is insufficient and trouble is generated in the protection of a circuit.

If the drying is too enough, cross-linking and polymerization reaction advances too much due to heat quantity, remaining parts of the solder resist cannot be mounted on a non-printing area which is an unnecessary portion of the solder resist layer 20 in the developing process.

In this embodiment, the light and shade is applied such that a difference occurs in the quantity of transmission of ultraviolet rays on printing area parts 42 and 43 of the light and shade mask film 40, thereby it is possible to change refractive index or transparency of a predetermined portion of the solder resist layer (solder resist ink layer) and visually recognize a shape of the predetermined portion through a color of foundation by a difference of refractive index or transparency between the predetermined portion and other portion. That is to say, letters, marks and so on in which the shape of the predetermined portion shows can be visually recognized.

[Second Manufacturing Method]

Figure 7:
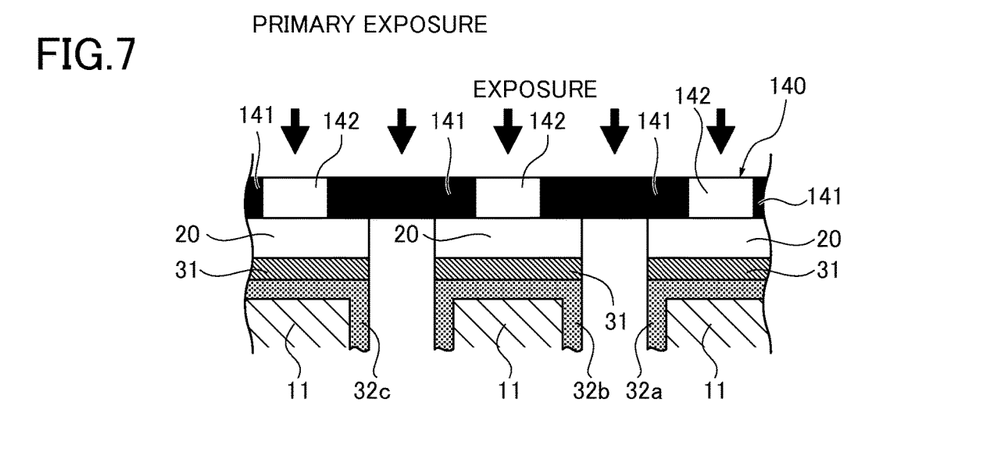
FIG. 7 is an explanatory view showing a primary exposure of a solder resist layer of the circuit substrate shown in FIG. 4.

FIG. 7 shows a second manufacturing method. The second manufacturing method is adapted to cover a negative-type solder mask film (first pattern mask film: mask film for solder resist) 140 on the formed solder resist layer 20, similarly to the first manufacturing method. The black portion 141 of the solder mask film 140 cuts ultraviolet rays, and a white portion 142 transmits approximately 100% of ultraviolet rays.

The solder mask film 140 is irradiated from above thereof with ultraviolet rays to perform a primary exposure of the solder resist layer 20. In this case, an amount of irradiation of ultraviolet rays is 10 to 300 [mj/cm$^2$], preferably, 40 to 150 [mJ/cm$^2$]. Because the irradiation amount is less, the irradiated portion of the solder resist layer 20 irradiated with weak ultraviolet rays. The irradiated portion has transmissivity that transmits light and a surface of the irradiated portion is hardened.

Mote that if the amount of irradiation is 10 [mJ/cm$^2$] or less, the hardening is insufficient, the solder resist layer 20 of each of the display parts 21 to 23 (see FIG. 1) falls in the developing process. If the amount of irradiation is 300 [mJ/cm2] or more, the transparency of each of the display parts 21 to 23 is reduced.

Figure 8:
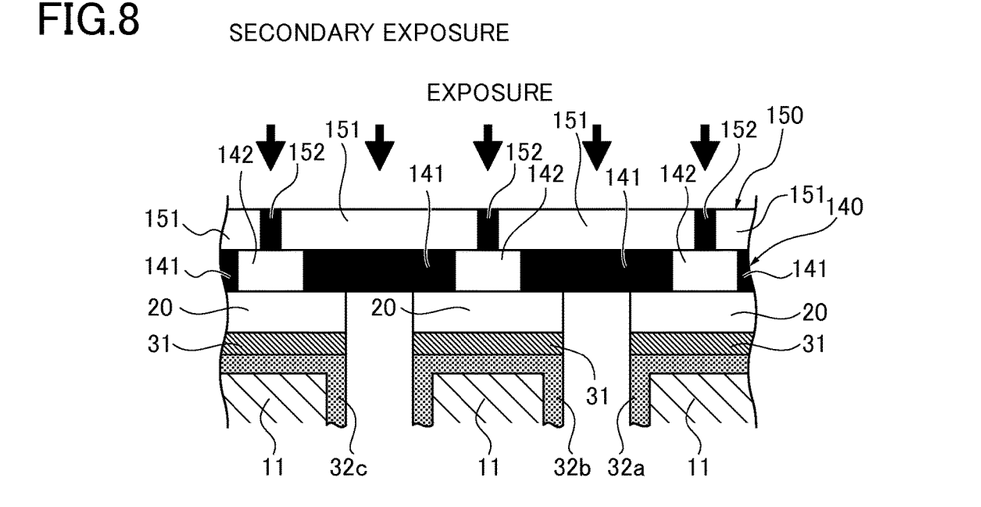
FIG. 8 is an explanatory view showing a secondary exposure of the solder resist layer of the circuit substrate shown in FIG. 7.

Thereafter, a solder mask film (second pattern mask film: a mask film for letter and mark) 150 for letters is covered on the solder mask film 140, as shown in FIG. 8. A black portion 151 of the solder mask film 150 for letter cuts ultraviolet rays and a white portion 152 transmits approximately 100% of ultraviolet rays. Thus, the mask film that controls the amount of irradiation of ultraviolet rays is configured by the solder mask film 140 and the solder mask film 150 for letters.

The solder mask film 150 for letters is irradiated from above thereof with ultraviolet rays. That is to say, a secondary exposure is executed. The amount of irradiation is 50 to 800 [mJ/cm$^2$], preferably 100 to 600 [mJ/cm$^2$]. The irradiation makes it possible to pass ultraviolet rays through only a portion where the white portion 142 and the solder mask film 140 and the white portion 151 of the solder mask film 150 for letters overlap to irradiate the solder resist layer 20 with ultraviolet rays.

Figure 9:
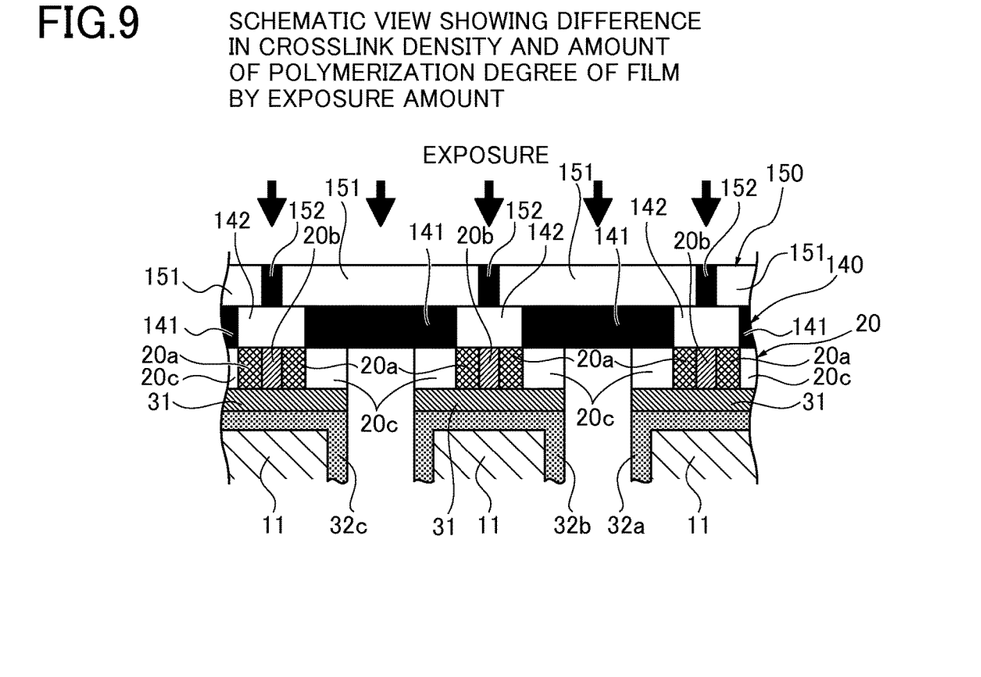
FIG. 9 is a schematic view showing a transparent portion of the solder resist layer formed by the primary exposure and the secondary exposure and a portion where ultraviolet rays are not irradiated.

Therefore, only the residual part 20*a* of the solder resist layer 20 is strongly irradiated, as shown in FIG. 9 and the residual part 20*a* only is hardened in opaque. Because the residual part 20*b* is not irradiated with ultraviolet rays for the secondary exposure, a state where the surface only is hardened is maintained. The portion 20*c* is not hardened because ultraviolet rays for the primary and secondary exposures are not irradiated.

Note that in a case where the amount of irradiation is 50 [mJ/cm$^2$] or less or 800 [mJ/cm$^2$] or more, the same problems as the above are generated.

Thereafter, by executing the developing process, the portion 20*c* of the solder resist layer 20 is removed, thereafter, by executing a heat process after drying, the residual parts 20*a* and 20*b* are fixed to the ink layer 31 to complete the circuit substrate 30, as shown in FIG. 6.

Figure 10:
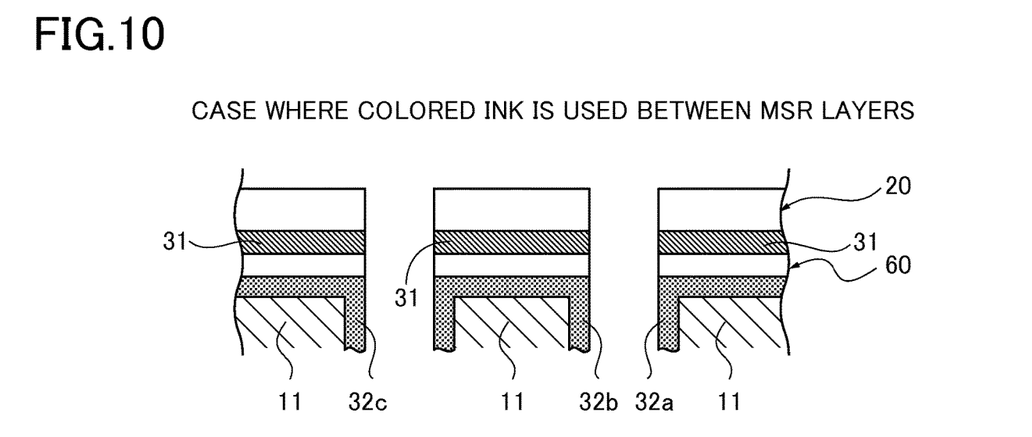
FIG. 10 is a schematic view showing a circuit substrate in which an ink layer is provided between solder resist layers.

In the second embodiment, the ink layer 31 as the primary layer is provided between the circuit substrate body 11 and the solder resist layer 20. However, a similar type of solder resist layer to or different type of solder resist layer 60 from the solder resist layer 20 may be provided under the ink layer 31, as shown in FIG. 10. Alternatively, the ink layer 31 may be configured to have conductivity.

In this way, it is possible to form even a small letter, for example, a small letter which cannot be printed clearly by a screen printing, because the display parts 21 to 23 (see FIG. 1) are clearly formed by irradiating the solder resist layer 20 formed by the mixing resin of the epoxy-based resin and the acrylic-based resin with ultraviolet rays through the light and shade mask film 40, the solder mask film 140 and the solder mask film 150 for letter. Therefore, even if the circuit substrate has a small mounting area, it is possible to display letters, marks and so on of all electric parts to be mounted.

[Third Embodiment]

Figure 11:
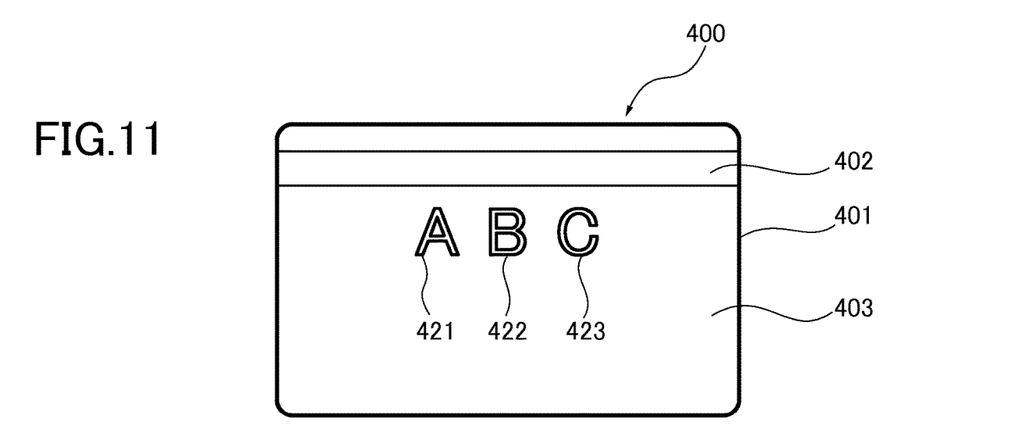
FIG. 11 is a plan view showing a magnetic card.

FIG. 11 illustrates a magnetic card 400 in which letters and so on are provided, similarly to the above. The magnetic card 400 includes a magnetic card body (substrate body) 401, and a magnetic layer 402 and a solder resist layer 403 which are provided on an upper surface of the magnetic card body 401. Display parts 421 to 423 which are predetermined portions of letters A, B and C are provided on the solder resist layer 403 by the first method or the second method. A printing process to display the letters also is not required to the magnetic card 400.

Figure 12:
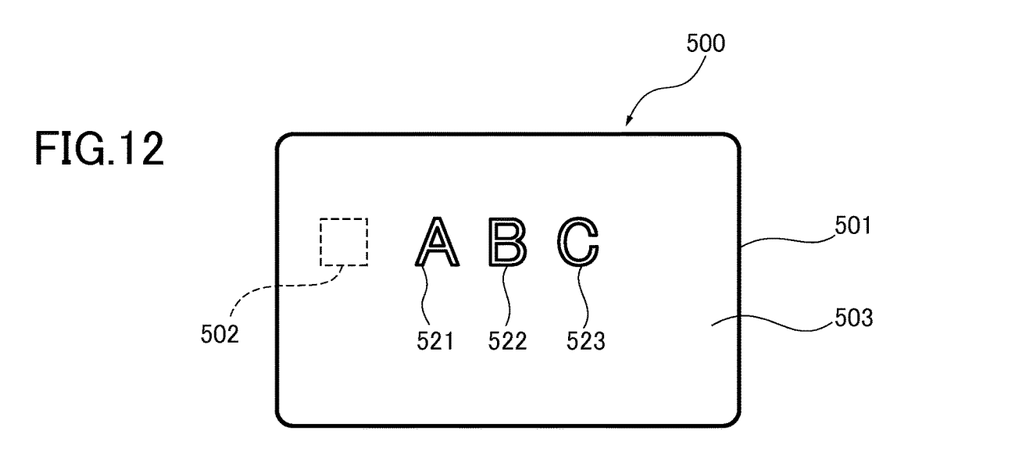
FIG. 12 is a plan view showing an IC card.

Other than the magnetic card 400, the embodiment can be applied to an IC card (substrate) 500 in which an IC chip is embedded in an IC card body 501, as shown in FIG. 12, for example. In the IC card 500, a solder resist layer 503 is provided on an upper surface of the IC card body 501 and an upper surface of the IC chip 502. Letters A, B and C as display parts (predetermined portions) 521 to 523 are formed on the solder resist layer 503 by the first method or the second method.

Similarly, the embodiment can be applied to other card (substrate), for example, a name plate (substrate) displaying rating and so on of a product. Even in this case, a solder resist layer is provided on a surface of a body (not shown) of the name plate, which is the body of the substrate and then letters and so on are formed, similarly to the above.

Furthermore, the embodiment can be applied to a display panel (substrate) on which a display, an operation switch and so on are provided. Even in this case, a solder resist layer is provided on a surface of a display panel body (not shown) which is the substrate body and then letters and so on are formed, similarly to the above.

Figure 13:
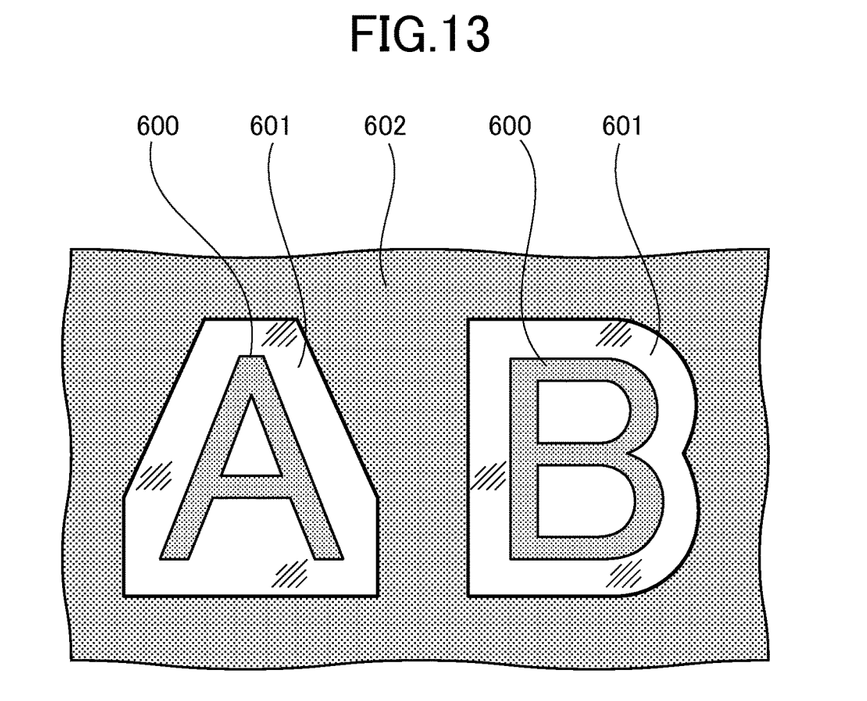
FIG. 13 is an explanatory view showing other display method.
Figure 14:
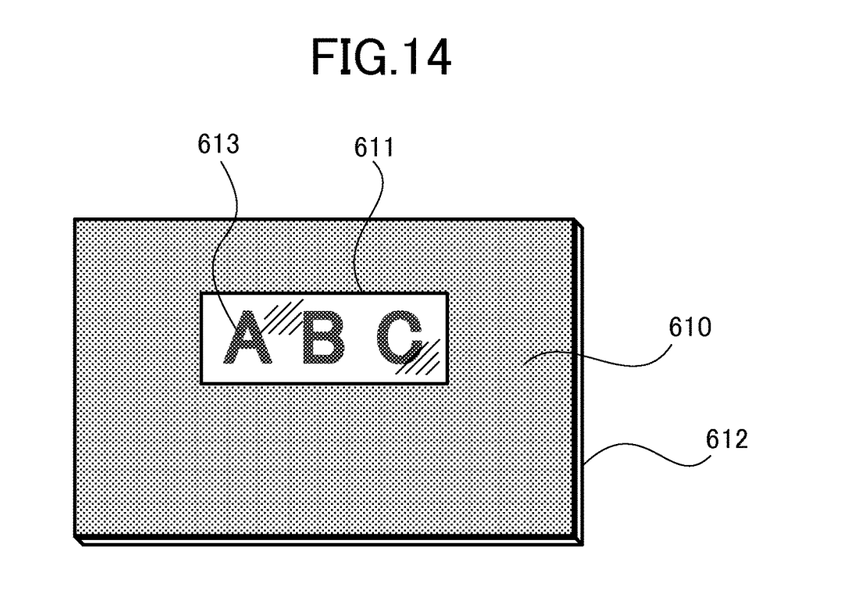
FIG. 14 is an explanatory view showing a display method in other example.

In each of the embodiments described above, the display parts 21 to 23, 421 to 423 and 521 to 523 are transparent. However, as shown in FIG. 13, a letter portion 600 may be opaque and a circumferential portion 601 thereof which is the predetermined portion may be transparent, thereby displaying the letters and so on. In addition, as shown in FIG. 14, a display 611 which is, for example, a rectangular transparent predetermined portion may be provided on the solder resist layer 610. Thereby, the letters 613 and so on formed on an upper surface of a substrate body 612 can be visually recognized through the display 611.

In the embodiments described above, although the substrate in which the solder resist layer is provided on the one surface of the substrate body has been described, even in the case where the solder resist layers are provided on the both surfaces of the substrate body, the letter part may be provided on the both surfaces, similarly to the above.

EXPERIMENTAL EXAMPLES

Next, experimental examples and comparative examples are described as follows. Common machineries and materials used for the experimental examples and the comparative examples were as follows.
(1) A both-surface through-hole substrate (size: 500 dm² (250 mm×200 mm), hereinafter referred to as substrate) which is a testing substrate in which an etching process is completed, manufactured by Tokai Shinei Electronics Industry Co., Ltd.
(2) For surface cleaning and conditioning (brush polishing): Scrub polisher (abrasive grain #180) manufactured by Ishii Hyoki Co., Ltd was used.
(3) For application of colored ink: Screen Printer DF65P manufactured by Mino Group Company was used.
(4) For application of solder resist ink: Screen Printer DF65P manufactured by Mino Group Company was used.
(5) As colored ink: SSR-6500C manufactured by San-Ei Kagaku Co., Ltd. was used.
(6) A warm-air dryer: Box Dryer manufactured by Mesh Corporation was used.
(7) An exposure Machine: THE-700MC manufactured by Hi-tech Co., Ltd. was used.
(8) Developer: 2% (v/v) solution of developer (name of a product: D-701) manufactured by Yamatoya & Co. Ltd.
(9) A developing machine: manufactured by Tokyo Kakoki Co., ltd.
(10) A mask film for a solder resist: a negative type for testing manufactured by Tokai Shinei Electronics Industry Co., Ltd.
(11) A mask film for letter: a positive type for testing manufactured by Tokai Shinei Electronics Industry Co., Ltd.

A summary of a method of preparing evaluation machineries and materials for experimental examples is described in the following. Here, the solder resist ink is formed by a mixing resin of epoxy-based resin and acrylic-based resin in which carboxylic acid partially remains, or a material adding acrylic-based resin in which carboxylic acid partially remains to epoxy-based resin.

Substrate body 11⇒ surface cleaning and conditioning—drying⇒ application of colored ink⇒ drying A⇒ application of MSR (solder resist layer)⇒ drying B⇒ primary exposure⇒ secondary exposure⇒ development (30° C., 0.25 MPa, execution of speed control to be capable of developing with ½ of an effective length of a chamber)⇒ drying (50 min/150° C.)⇒ evaluation. Working conditions of experimental examples 1 to 9 are shown in Table 1. Here, the name of product: SSR-6600W manufactured by San-Ei Kagaku Co., Ltd. was used for the MSR.

TABLE 1

| ITEMS | COLORED INK | | MSR | | PRIMARY EXPOSURE (mJ/cm²) | SECONDARY EXPOSURE (mJ/cm²) |
| --- | --- | --- | --- | --- | --- | --- |
| | THICKNESS (μm) | DRYING A (60° C.) | THICKNESS (μm) | DRYING B (80° C.) | | |
| EXPERIMENTAL EXAMPLE 1 | 2 | 5 min. | 30 | 20 min. | 70 | 400 |
| EXPERIMENTAL EXAMPLE 2 | 2 | 5 min. | 100 | 30 min. | 150 | 800 |
| EXPERIMENTAL EXAMPLE 3 | 5 | 7 min. | 30 | 20 min. | 70 | 400 |
| EXPERIMENTAL EXAMPLE 4 | 10 | 10 min. | 30 | 20 min. | 70 | 400 |
| EXPERIMENTAL EXAMPLE 5 | 10 | 10 min. | 100 | 30 min. | 150 | 800 |
| EXPERIMENTAL EXAMPLE 6 | 50 | 20 min. | 30 | 20 min. | 70 | 400 |
| EXPERIMENTAL EXAMPLE 7 | 50 | 20 min. | 100 | 30 min. | 150 | 800 |
| EXPERIMENTAL EXAMPLE 8 | 2 | 5 min. | 5 | 5 min. | 20 | 100 |
| EXPERIMENTAL EXAMPLE 9 | 100 | 30 min. | 300 | 50 min. | 300 | 1500 |

A shape of the predetermined portion could be visually recognized through the foundation color by a difference in the refractive index and the transparency of the predetermined portion and other portion.

Working conditions of comparative examples 1 to 2 are shown in Table 2.

The used solder resist ink was a photo finer PSR-4000 CC02/CA-40 (the name of product) (hereinafter referred to as SR) which does not contain epoxy-based resin and is manufactured by Taiyo Ink MfG. Co., Ltd.

TABLE 2

| ITEMS | COLORED INK | | SR | | PRIMARY EXPOSURE (mJ/cm²) | SECONDARY EXPOSURE (mJ/cm²) |
| --- | --- | --- | --- | --- | --- | --- |
| | THICKNESS (μm) | DRYING A/ (60° C.) | THICKNESS (μm) | DRYING B/ (80° C.) | | |
| COMPARATIVE EXAMPLE 1 | 10 | 10 min. | 30 | 20 min. | 70 | 400 |
| COMPARATIVE EXAMPLE 2 | 10 | 10 min. | 100 | 30 min. | 150 | 800 |

Next, a summary of a method of preparing evaluation machineries and materials in a case where the ink layer 31 (see FIG. 10) is provided between the two solder resist layers is described in the following.

Substrate⇒ surface cleaning and conditioning—drying⇒ application of primary MSR (primary solder resist layer)⇒ drying C⇒ application of colored ink⇒ drying D⇒ application of secondary MSR (secondary solder resist layer)⇒ drying E⇒ primary exposure⇒ secondary exposure⇒ development (30° C., 0.25 MPa, execution of speed control to be capable of developing with ½ of an effective length of a chamber)⇒ drying (50 min/150° C.)⇒ evaluation.

Working conditions of experimental examples 10 to 13 are shown in Table 3. The name of product, SSR-6600 manufactured by San-Ei Kagaku Co., Ltd. was used for the primary and secondary solder resist layers.

TABLE 3

| ITEMS | PRIMARY MSR | | COLORED INK | | SECONDARY MSR | | PRIMARY EXPOSURE (mJ/cm²) | SECONDARY EXPOSURE (mJ/cm²) |
| --- | --- | --- | --- | --- | --- | --- | --- | --- |
| | THICKNESS (μm) | DRYING C/(80° C.) | THICKNESS (μm) | DRYING B/(60° C.) | THICKNESS (μm) | DRYING C/(80° C.) | | |
| EXPERIMENTAL EXAMPLE 10 | 5 | 7 min. | 10 | 10 min. | 30 | 20 min. | 70 | 400 |
| EXPERIMENTAL EXAMPLE 11 | 10 | 10 min. | 5 | 7 min. | 30 | 20 min. | 70 | 400 |
| EXPERIMENTAL EXAMPLE 12 | 10 | 10 min. | 10 | 10 min. | 30 | 20 min. | 70 | 400 |
| EXPERIMENTAL EXAMPLE 13 | 10 | 10 min. | 10 | 10 min. | 100 | 30 min. | 150 | 800 |

Working conditions of comparative examples 3 and 4 are shown in Table 4.

The photo finer PSR-4000 CC02/CA-40 (the name of product) manufactured by Taiyo Ink MfG. Co., Ltd was used for the used primary and secondary SRs.

TABLE 4

| ITEMS | PRIMARY SR | | COLORED INK | | SECONDARY SR | | PRIMARY EXPOSURE (mJ/cm²) | SECONDARY EXPOSURE (mJ/cm²) |
| --- | --- | --- | --- | --- | --- | --- | --- | --- |
| | THICKNESS (μm) | DRYING C/(80° C.) | THICKNESS (μm) | DRYING B/(60° C.) | THICKNESS (μm) | DRYING C/(80° C.) | | |
| COMPARATIVE EXAMPLE 3 | 10 | 10 min. | 10 | 10 min. | 30 | 20 min. | 70 | 400 |
| COMPARATIVE EXAMPLE 4 | 10 | 10 min. | 10 | 10 min. | 100 | 30 min. | 150 | 800 |

The preparation of evaluation machineries and materials in a case where two MSR layers are used and the drying time of the primary MSR layer is changed.

A summary of preparation of evaluation machineries and materials of experimental examples 14 to 17 is sown in the following.

Substrate⇒ surface cleaning and conditioning—drying⇒ application of colored ink⇒ drying C⇒ application of primary MSR⇒ drying D⇒ application of secondary MSR⇒ drying E⇒ exposure⇒ development (30° C.,0.25 MPa, execution of speed control to be capable of developing with ½ of an effective length of a chamber)⇒ drying (50 min/150° C.)⇒ evaluation. Working conditions of experimental examples 14 to 17 are shown in Table 5.

The name of product: SSR-6600 manufactured by San-Eikagaku Co., Ltd. was used for the used MSR (primary and secondary solder resist layers).

TABLE 5

| ITEMS | COLORED INK THICKNESS (μm) | COLORED INK DRYING C/ (60° C.) | PRIMARY MSR THICKNESS (μm) | PRIMARY MSR DRYING D/ (130° C.) | SECONDARY MSR THICKNESS (μm) | SECONDARY MSR DRYING E/ (80° C.) | EXPOSURE (mJ/cm$^2$) |
|---|---|---|---|---|---|---|---|
| EXPERIMENTAL EXAMPLE 14 | 10 | 10 min. | 10 | 5 min. | 30 | 20 min. | 400 |
| EXPERIMENTAL EXAMPLE 15 | 10 | 10 min. | 10 | 10 min. | 30 | 20 min. | 400 |
| EXPERIMENTAL EXAMPLE 16 | 10 | 10 min. | 10 | 20 min. | 30 | 20 min. | 400 |
| EXPERIMENTAL EXAMPLE 17 | 10 | 10 min. | 10 | 40 min. | 30 | 20 min. | 400 |

Working conditions of a comparative example 5 are shown in Table 6.

The used SR was the photo finer PSR-4000 CC02/CA-40 (the name of product) manufactured by Taiyo Ink MfG. Co., Ltd.

TABLE 6

| ITEMS | COLORED INK THICKNESS (μm) | COLORED INK DRYING C/ (60° C.) | PRIMARY SR THICKNESS (μm) | PRIMARY SR DRYING D/ (130° C.) | SECONDARY SR THICKNESS (μm) | SECONDARY SR DRYING E/ (80° C.) | EXPOSURE (mJ/cm$^2$) |
|---|---|---|---|---|---|---|---|
| COMPARATIVE EXAMPLE 5 | 10 | 10 min. | 10 | 10 min. | 30 | 20 min. | 400 |

The preparation of evaluation machineries and materials in a case where the solder portion and the predetermined potion are formed on the same film is described.

Figure 15:
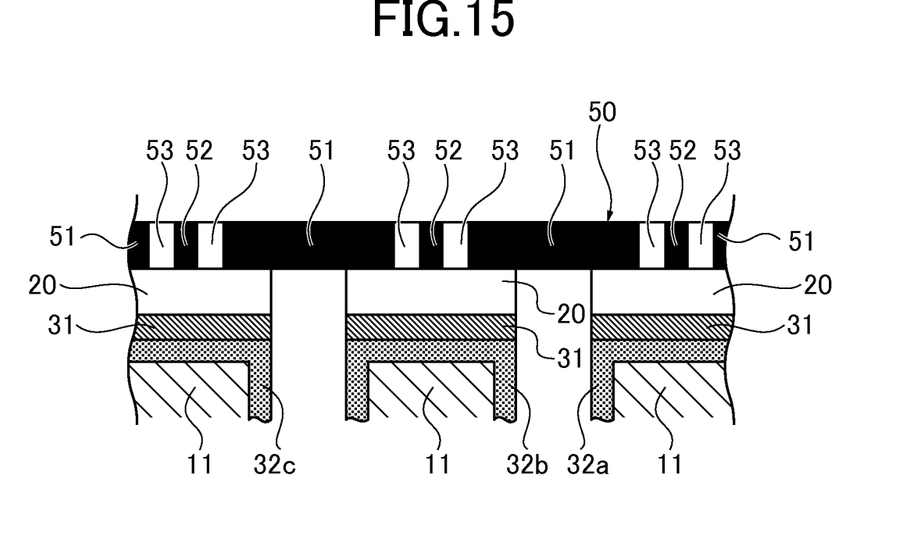
FIG. 15 is an explanatory view schematically showing a case where the primary exposure of the solder resist layer is executed by use of a composite mask film.

The same film (composite mask film) was used as a mask film for the primary exposure. Here, FIG. 15 is an explanatory view schematically showing a case where a primary exposure of the solder resist layer 20 is executed by use of a composite mask film 50. Reference number 51 shows a portion cutting ultraviolet rays, which is a mask for solder resist. Reference number 52 shows a mask for letter, reference number 53 a portion transmitting approximately 100% of ultraviolet rays. The mask 52 for letter has a transmittance of 15 to 35% of ultraviolet rays.

After the primary exposure is completed, a secondary exposure is executed by use of a mask film (not shown) for solder resist. This exposure order may be reversed.

A summary of preparation of evaluation machineries and materials of experimental examples 18 to 19 is shown in the following.

Substrate⇒ surface cleaning and conditioning—drying⇒ application of colored ink⇒ drying A⇒ application of MSR (solder resist layer)⇒ drying B⇒ primary exposure⇒ secondary exposure⇒ development (30° C., 0.25 MPa, execution of speed control to be capable of developing with ½ of an effective length of a chamber)⇒ drying (50 min/150° C.)⇒ evaluation. Working conditions of experimental examples 18 to 20 are shown in Table 7.

The name of product, SSR-6600W manufactured by San-Ei Kagaku Co., Ltd. was used for the MSR.

TABLE 7

| ITEMS | COLORED INK THICKNESS (μm) | COLORED INK DRYING A/ (60° C.) | MSR THICKNESS (μm) | MSR DRYING B/ (80° C.) | PRIMARY EXPOSURE (mJ/cm$^2$) | SECONDARY EXPOSURE (mJ/cm$^2$) |
|---|---|---|---|---|---|---|
| EXPERIMENTAL EXAMPLE 18 | 10 | 10 min. | 30 | 20 min. | 400 | 70 |
| EXPERIMENTAL EXAMPLE 19 | 10 | 10 min. | 60 | 25 min. | 400 | 70 |
| EXPERIMENTAL EXAMPLE 20 | 10 | 10 min. | 100 | 30 min. | 800 | 150 |

A summary of a method of preparing evaluation machineries and materials in a case using a light and shade pattern mask film is shown in the following.

Substrate⇒ surface cleaning and conditioning—drying⇒ application of colored ink⇒ drying A⇒ application of MSR⇒ drying B⇒ setting of light and shade film⇒ exposure⇒ development (30° C., 0.25 MPa, execution of speed control to be capable of developing with ½ of an effective length of a chamber)⇒ drying (50 min/150° C.)⇒ evaluation. Working conditions of experimental examples 21 to 24 are shown in Table 8.

The name of product, SSR-6600W manufactured by San-Eikagaku Co., Ltd. was used for the MSR.

TABLE 8

| ITEMS | COLORED INK | | MSR | | INTERCEPTION RATE OF IRRADIATION DOSE (%) | EXPOSURE (mJ/cm²) |
|---|---|---|---|---|---|---|
| | THICKNESS (μm) | DRYING C/ (60° C.) | THICKNESS (μm) | DRYING E/ (80° C.) | | |
| EXPERIMENTAL EXAMPLE 21 | 10 | 10 min. | 10 | 10 min. | 95 | 400 |
| EXPERIMENTAL EXAMPLE 22 | 10 | 10 min. | 10 | 10 min. | 85 | 400 |
| EXPERIMENTAL EXAMPLE 23 | 10 | 10 min. | 10 | 10 min. | 75 | 400 |
| EXPERIMENTAL EXAMPLE 24 | 10 | 10 min. | 10 | 10 min. | 65 | 400 |

Working conditions of comparative examples 6 and 7 are shown in Table 9.

The used SR was the photo finer PSR-4000 CC02/CA-40 (the name of product) manufactured by Taiyo Ink MfG. Co., Ltd.

TABLE 9

| ITEMS | COLORED INK | | SR | | INTERCEPTION RATE OF IRRADIATION DOSE (%) | EXPOSURE (mJ/cm²) |
|---|---|---|---|---|---|---|
| | THICKNESS (μm) | DRYING C/ (60° C.) | THICKNESS (μm) | DRYING E/ (80° C.) | | |
| COMPARATIVE EXAMPLE 6 | 10 | 10 min. | 10 | 10 min. | 95 | 400 |
| COMPARATIVE EXAMPLE 7 | 10 | 10 min. | 10 | 10 min. | 85 | 400 |

An evaluation method was executed with visual observation as to whether the identification letters, marks and so on the circuit substrate after the MRS and SR processes are readable about four manners of "clearly readable", "readable", "readable even if unclearness", and "not readable" in a room of a predetermined brightness.

The evaluation results are shown in Table 10.

TABLE 10

| ITEMS | EVALUATION | | | |
|---|---|---|---|---|
| | CLEARLY READABLE | READABLE | READABLE EVEN IF UN-CLEARNESS | NOT READABLE |
| EXPERIMENTAL EXAMPLE 1 | | | ○ | |
| EXPERIMENTAL EXAMPLE 2 | | | ○ | |
| EXPERIMENTAL EXAMPLE 3 | | ○ | | |
| EXPERIMENTAL EXAMPLE 4 | ○ | | | |
| EXPERIMENTAL EXAMPLE 5 | ○ | | | |
| EXPERIMENTAL EXAMPLE 6 | ○ | | | |
| EXPERIMENTAL EXAMPLE 7 | ○ | | | |
| EXPERIMENTAL EXAMPLE 8 | | | ○ | |
| EXPERIMENTAL EXAMPLE 9 | | | ○ | |
| EXPERIMENTAL EXAMPLE 10 | ○ | | | |
| EXPERIMENTAL EXAMPLE 11 | | ○ | | |
| EXPERIMENTAL EXAMPLE 12 | ○ | | | |
| EXPERIMENTAL EXAMPLE 13 | | | ○ | |
| EXPERIMENTAL EXAMPLE 14 | | | ○ | |
| EXPERIMENTAL EXAMPLE 15 | | ○ | | |
| EXPERIMENTAL EXAMPLE 16 | | | ○ | |
| EXPERIMENTAL EXAMPLE 17 | | | | ○ |
| EXPERIMENTAL EXAMPLE 18 | ○ | | | |
| EXPERIMENTAL EXAMPLE 19 | ○ | | | |
| EXPERIMENTAL EXAMPLE 20 | | ○ | | |
| EXPERIMENTAL EXAMPLE 21 | ○ | | | |
| EXPERIMENTAL EXAMPLE 22 | ○ | | | |
| EXPERIMENTAL EXAMPLE 23 | | ○ | | |
| EXPERIMENTAL EXAMPLE 24 | | | ○ | |
| COMPARATIVE EXAMPLE 1 | | | | ○ |
| COMPARATIVE EXAMPLE 2 | | | | ○ |
| COMPARATIVE EXAMPLE 3 | | | | ○ |
| COMPARATIVE EXAMPLE 4 | | | | ○ |
| COMPARATIVE EXAMPLE 5 | | | | ○ |
| COMPARATIVE EXAMPLE 6 | | | | ○ |
| COMPARATIVE EXAMPLE 7 | | | | ○ |

The present invention is not limited to the above-mentioned embodiments, modifications and changes can be made to the embodiments as long as such modifications and changes are within the scope of the present invention as defined by the Claims.

The invention claimed is:

1. A method of manufacturing a substrate, comprising:
providing a substrate body;
applying solder resist ink containing a mixing resin of epoxy-based resin and acrylic-based resin on at least a surface of the substrate body to form a solder resist layer;
irradiating the solder resist layer with ultraviolet rays through a mask film that covers the solder resist layer, and exposing the solder resist layer once; and
executing a developing process after the irradiating and the exposing,
wherein the mask film comprises:
a first portion that transmits the ultraviolet rays with a predetermined amount of transmission;
a second portion that transmits the ultraviolet rays with a higher amount of transmission than the predetermined amount of transmission transmitted through the first portion; and
a third portion that does not transmit the ultraviolet rays,
wherein the irradiating comprises:
covering a predetermined portion of the solder resist layer with the first portion of the mask film and irradiating the covered predetermined portion of the solder resist layer through the first portion, wherein the first portion of the mask film reduces an amount of irradiation of the ultraviolet rays to the predetermined portion, such that the predetermined portion remains in the solder resist layer after developing to form a transparent part,
partially covering the solder resist layer with the second portion of the mask film and irradiating the covered portion of the solder resist layer through the second portion, wherein the second portion of the mask film transmits a higher amount of irradiation of the ultraviolet rays than amount of the irradiation transmitted to the predetermined portion, such that the covered portion remains in the solder resist layer after developing to form an opaque part, and
partially covering the solder resist layer with the third portion of the mask film to shield the covered portion of the solder resist layer from irradiation by the ultraviolet rays,
wherein the transparent part has a shape to show information of an electronic part to be mounted on the substrate body, and
the developing process removes the covered portion of the solder resist layer which was covered with the third portion of the mask film for mounting an electronic part to the substrate body.

2. The method of manufacturing a substrate according to claim 1
further comprising forming a colored layer between the solder resist layer and the substrate body.

3. The method of manufacturing a substrate according to claim 2, wherein
the colored layer is formed as a primer layer.

4. The method of manufacturing a substrate according to claim 1, including
executing a heating process after the developing process.

5. A method of manufacturing a circuit substrate, comprising:
providing a circuit substrate;
applying to the circuit substrate a solder resist ink containing a mixing resin of epoxy-based resin and acrylic-based resin in which carboxylic acid partially remains, or adding acrylic-based resin in which carboxylic acid partially remains to epoxy-based resin on the circuit substrate, to form a solder ink layer; and
changing a refractive index or a transparency of the solder ink layer to visually show information of an electronic part to be mounted on the substrate body through a foundation color of the circuit substrate based on a difference in the refractive index or the transparency.

6. The method of manufacturing a circuit substrate according to claim 5, including
providing colored ink having functional group as a primer layer between the circuit substrate and the solder ink layer,
wherein the colored ink has a thickness of 2 μm to 300 μm.

7. A substrate manufactured by the method of claim 1, comprising:
a substrate body; and
a solder resist layer formed on at least one surface of the substrate body,
wherein the solder resist layer is formed by a solder ink layer containing a mixing resin of epoxy-based resin and acrylic-based resin,
the solder resist layer comprises a residual part, and a removed portion for mounting an electronic part,
the residual part comprises an opaque part, and a transparent part for showing information of an electronic part mounted on the substrate body, and
the transparent part has a shape to show information of the electronic part.

8. The substrate according to claim 7,
further comprising a colored layer provided between the solder resist layer and the substrate body.

9. A substrate comprising:
a substrate body; and
a solder resist layer formed on at least one surface of the substrate body, wherein
the solder resist layer is formed by a solder ink layer containing a mixing resin of epoxy-based resin and acrylic-based resin, and
the solder resist layer includes a transparent part formed with irradiation of ultraviolet rays such that a surface only of the transparent part is hardened, and
the transparent part has a shape to show information of an electronic part mounted on the substrate body,
wherein the solder resist layer is formed in two layers, and
a colored layer or conductive colored layer is provided between the two layers.

10. The substrate according to claim 7, wherein the substrate body is a name plate body or display panel body.

11. The substrate according to claim 7, wherein
the substrate body is a circuit substrate body including a circuit pattern formed on at least one surface of the substrate body and the circuit pattern is protected by the solder resist layer.

12. The substrate according to claim 7, wherein
the substrate body is a magnetic card body on which a magnetic recording layer is provided, or IC card body in which an IC chip is embedded.

* * * * *